(12) United States Patent
Xu et al.

(10) Patent No.: US 11,862,925 B2
(45) Date of Patent: Jan. 2, 2024

(54) TUNABLE NARROW-LINEWIDTH PHOTO-GENERATED MICROWAVE SOURCE BASED ON POLARIZATION CONTROL

(71) Applicant: SOUTH CHINA UNIVERSITY OF TECHNOLOGY, Guangdong (CN)

(72) Inventors: Shanhui Xu, Guangdong (CN); Qilai Zhao, Guangdong (CN); Zhitao Zhang, Guangdong (CN); Changsheng Yang, Guangdong (CN); Zhouming Feng, Guangdong (CN); Zhongmin Yang, Guangdong (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 477 days.

(21) Appl. No.: 17/277,305

(22) PCT Filed: Oct. 30, 2018

(86) PCT No.: PCT/CN2018/112817
§ 371 (c)(1),
(2) Date: Mar. 18, 2021

(87) PCT Pub. No.: WO2020/056852
PCT Pub. Date: Mar. 26, 2020

(65) Prior Publication Data
US 2021/0351558 A1 Nov. 11, 2021

(30) Foreign Application Priority Data

Sep. 21, 2018 (CN) .......................... 201811109048.0

(51) Int. Cl.
*H01S 3/13* (2006.01)
*H01S 3/08* (2023.01)
(Continued)

(52) U.S. Cl.
CPC .......... *H01S 3/1308* (2013.01); *H01S 3/0675* (2013.01); *H01S 3/06716* (2013.01);
(Continued)

(58) Field of Classification Search
CPC .. H01S 3/1308; H01S 3/06716; H01S 3/0675; H01S 3/08013; H01S 3/08054;
(Continued)

(56) References Cited

U.S. PATENT DOCUMENTS

2017/0026131 A1   1/2017   Orcutt

FOREIGN PATENT DOCUMENTS

CN   101447637   6/2009
CN   101540468   9/2009
(Continued)

OTHER PUBLICATIONS

"International Search Report (Form PCT/ISA/210) of PCT/CN2018/112817," dated Jun. 12, 2019, with English translation thereof, pp. 1-6.

*Primary Examiner* — Harry K Liu
(74) *Attorney, Agent, or Firm* — JCIPRNET

(57) ABSTRACT

A tunable narrow-linewidth photo-generated microwave source based on polarization control includes a high-reflectivity fiber grating, a high-gain fiber, a low-reflectivity polarization-maintaining fiber grating, a stress adjusting device, a single-mode semiconductor pump laser, an optical wavelength division multiplexer, a polarization beam splitter, a polarization controller, an optical coupler, and a photoelectric detector. Birefringence distribution in the low-reflectivity polarization-maintaining fiber grating is controlled by adjusting a stress magnitude of the stress adjusting device to the low-reflectivity polarization fiber grating, thereby controlling a laser frequency working in different polarization modes in a resonant cavity, and a tunable (Continued)

narrow-linewidth photo-generated microwave source is generated by a beat-frequency technology using a dual-wavelength narrow-linewidth laser with variable frequency intervals.

18 Claims, 2 Drawing Sheets

(51) Int. Cl.
- *H01S 3/067* (2006.01)
- *H01S 3/094* (2006.01)
- *H01S 3/0941* (2006.01)
- *H01S 3/10* (2006.01)
- *H01S 3/16* (2006.01)

(52) U.S. Cl.
CPC ...... *H01S 3/08013* (2013.01); *H01S 3/08054* (2013.01); *H01S 3/09415* (2013.01); *H01S 3/094003* (2013.01); *H01S 3/10061* (2013.01); *H01S 3/1608* (2013.01); *H01S 3/1618* (2013.01)

(58) Field of Classification Search
CPC ........... H01S 3/094003; H01S 3/09415; H01S 3/10061; H01S 3/1608; H01S 3/1618
USPC ........................................................ 342/361
See application file for complete search history.

(56) References Cited

FOREIGN PATENT DOCUMENTS

| CN | 201392985 | | 1/2010 | | |
|---|---|---|---|---|---|
| CN | 102306897 | | 1/2012 | | |
| CN | 102306900 | A * | 1/2012 | ........... | H01S 3/1068 |
| CN | 104466636 | | 3/2015 | | |
| CN | 105406330 | | 3/2016 | | |
| CN | 105703208 | A * | 6/2016 | ......... | H01S 3/06712 |
| CN | 205488991 | | 8/2016 | | |
| CN | 106229804 | A * | 12/2016 | ........... | H01S 3/0675 |
| CN | 106525092 | | 3/2017 | | |
| CN | 108365513 | A * | 8/2018 | | |

\* cited by examiner

TUNABLE NARROW-LINEWIDTH PHOTO-GENERATED MICROWAVE SOURCE BASED ON POLARIZATION CONTROL

CROSS-REFERENCE TO RELATED APPLICATION

This application is a 371 of international application of PCT application serial no. PCT/CN2018/112817, filed on Oct. 30, 2018, which claims the priority benefit of China application no. 201811109048.0, filed on Sep. 21, 2018. The entirety of each of the above mentioned patent applications is hereby incorporated by reference herein and made a part of this specification.

TECHNICAL FIELD

The present invention mainly utilizes microwave photonics technologies, relates to a communication system for processing radio frequency signals by using optical technologies, and particularly relates to a tunable narrow-linewidth photo-generated microwave source based on polarization control.

BACKGROUND

Photo-generated microwave technology is an optical technology that carries microwave and millimeter wave signals in optical signals and transmits radio frequency signals in optical transmission media such as optical fibers. In an optical carrier radio frequency system, the generation, conversion and modulation of radio frequency signals are realized by adjusting and controlling laser signals. The photo-generated microwave technology makes use of the advantages of low transmission loss, long transmission distance and anti-interference of optical signals in optical fiber communication, and overcomes the disadvantages of low upper frequency limit and high signal noise of microwave and millimeter waves generated by traditional electrical means, which combines the advantages of microwave and optical fiber communications and becomes a research hotspot in the field of optical fiber communication at present.

To achieve the transmission of optical carrier radio frequency signals, the most important technical point is to achieve a high-quality tunable photo-generated microwave source. At present, there are three main ways to generate photo-generated microwave sources: an optical heterodyne method, an external modulation method and a photoelectric oscillator. The optical heterodyne method generates microwave signals by beat-frequency method, which is simple in structure and low in cost, but it is relatively difficult to realize a tunable output frequency. The external modulation is to modulate the optical signals through a phase modulator, which can generate microwave signals which are doubled or even higher than the modulated signals, so it is easy to obtain high-frequency microwave signals. However, the disadvantages of this method are that the phase modulator is expensive and requires an extra modulation signal generator, and the modulator itself has a large insertion loss, and can bear limited optical power. The photoelectric oscillator generates microwave signals through stable oscillation generated by a photoelectric loop, which has a wide tunable frequency range and high quality of microwave signals, but its structure is relatively complicated, and requirements on some components such as tunable filters are higher.

For a microwave source, a signal linewidth thereof is an important evaluation index. Especially in a phased array microwave radar, an optical carrier wireless communication system, a wireless sensor network, and a satellite communication system, a precise and tunable microwave source with narrow-linewidth is needed. Optical fiber laser output realized by a resonant cavity based on high-gain fiber has good narrow-linewidth characteristics. On this basis, using dual-frequency laser output by a single resonant cavity can effectively reduce the interference of an external environment, realize linewidth compression of the microwave signal, and improve performances of the output microwave signal.

SUMMARY

An objective of the present invention is to overcome the above shortcomings in the prior art, and discloses a tunable narrow-linewidth photo-generated microwave source based on polarization control, which realizes a wide-range narrow-linewidth microwave signal generation through an action of a stress adjusting device on a fiber grating.

The objective of the present invention is achieved by the following technical solutions.

A tunable narrow-linewidth photo-generated microwave source based on polarization control includes a high-reflectivity fiber grating, a high-gain fiber, a low-reflectivity polarization-maintaining fiber grating, a stress adjusting device, an optical wavelength division multiplexer, a single-mode semiconductor pump laser, a polarization beam splitter, a polarization controller, an optical coupler, and a photoelectric detector. The high-reflectivity fiber grating, the high-gain fiber, and the low-reflectivity polarization-maintaining fiber grating together form a resonant cavity of the optical fiber laser. The high-gain fiber serves as a gain medium of the resonant cavity. The high-reflectivity fiber grating and the low-reflectivity polarization-maintaining fiber grating form front and rear cavity mirrors of the resonant cavity, which are respectively connected with two ends of the high-gain fiber, so that a signal laser oscillates in the resonant cavity. The single-mode semiconductor pump laser injects a pump laser into the resonant cavity through the optical wavelength division multiplexer. Due to birefringence in the low-reflectivity polarization-maintaining fiber grating, two reflection peaks with different polarization modes and different central wavelengths exist, so that the laser is enabled to realize orthogonal dual-frequency narrow-linewidth optical fiber laser output through the wavelength division multiplexer, and the birefringence in the low-reflectivity polarization-maintaining fiber grating is output through the wavelength division multiplexer so that two orthogonal polarization mode lasers exist in the low-reflectivity polarization-maintaining fiber grating. Moreover, laser frequencies working in the two polarization modes are different. The polarization beam splitter divides two lasers with different frequencies and different polarizations output by the optical wavelength division multiplexer into fast-axis laser and slow-axis laser. A polarization state of the slow-axis laser is adjusted by the polarization controller to change an orthogonal relationship between the slow-axis laser and the fast-axis laser, is coupled with the fast-axis laser through the optical coupler and injected into the photoelectric detector, and a narrow-linewidth microwave signal is generated by a beat-frequency technology. The stress adjusting device is arranged on the low-reflectivity polarization-maintaining fiber grating, changes birefringence distribution in the grating by changing a stress magnitude applied to the low-reflectivity polarization-maintaining fiber grating, and outputs a tunable narrow-linewidth photo-generated microwave signal.

As a further optimization, the stress adjusting device is used for applying a lateral stress to the optical fiber to cause the birefringence distribution of the optical fiber to change, and a material of the stress adjusting device is piezoelectric ceramics, a mechanical adjusting frame or a heavy-object extrusion device.

As a further optimization, the resonant cavity of the optical fiber laser is a distributed Bragg reflection (DBR) cavity structure, a distributed feedback (DFB) cavity structure or an annular cavity structure.

As a further optimization, an optical fiber used in the low-reflectivity polarization-maintaining fiber grating is a panda polarization-maintaining fiber, a bow-tie polarization-maintaining fiber or an optical fiber engraved with dual-wavelength reflection peaks. The high-reflectivity fiber grating is a single mode fiber grating, wherein a reflection peak of the high-reflectivity fiber grating covers two reflection peaks of the low-reflectivity fiber grating, and the high-reflectivity fiber grating has a reflectivity to signal laser greater than 90%.

As a further optimization, a frequency response range of the photoelectric detector is larger than a beat-frequency signal frequency generated by an optical fiber laser source, and a material of the photoelectric detector comprises but is not limited to an indium-gallium-arsenic semiconductor material, a silicon semiconductor material or a germanium semiconductor material.

According to the present invention, the laser generated by the single-mode semiconductor laser is used as a pumping source, the high-gain optical fibers are pumped by the optical wavelength division multiplexer. The low-reflectivity polarization-maintaining fiber grating and the high-reflectivity fiber grating are used as the cavity mirrors of the resonant cavity of the laser to realize laser oscillation, and the laser passes through the low-reflectivity polarization-maintaining fiber grating, and narrow-linewidth laser is output from the optical wavelength division multiplexer. The birefringence in the polarization-maintaining fiber grating makes the polarization-maintaining fiber have two orthogonal polarization mode lasers, and the lasers frequencies working in the two polarization modes are different. The laser is divided into two by the polarization beam splitter, wherein one laser passes through the polarization controller, and a polarization state of the laser is changed by the polarization controller, and then the laser is re-coupled with another laser output by the polarization beam splitter through the optical coupler, and injected into the photoelectric detector, thus generating microwave signals. The stress adjusting device controls the birefringence distribution in the low-reflectivity polarization-maintaining fiber grating by applying the stress to the low-reflectivity polarization-maintaining fiber grating, thereby controlling the laser frequencies working in different polarization modes in the resonant cavity. Finally, the tunable narrow-linewidth photo-generated microwave source is generated by the beat-frequency technology using dual-wavelength narrow-linewidth lasers with variable frequency intervals.

Further, a central reflection wavelength of the high-reflectivity fiber grating is a laser output wavelength of 1550.12 nm, a 3 dB reflection spectrum width of 1.2 nm, and a central wavelength reflectivity greater than 99.95%. A central wavelength of a slow-axis reflection peak of the low-reflectivity polarization-maintaining fiber grating is 1550.12 nm, and a fast-axis reflection peak of the low-reflectivity polarization-maintaining fiber grating is 1550.50 nm, with a reflectivity of both 60%.

Further, the high-gain fiber is a phosphate gain fiber co-doped with erbium and ytterbium.

Compared with the prior art, the tunable narrow-linewidth photo-generated microwave source based on polarization control according to the present invention has the following advantages and technical effects.

The low-reflectivity polarization-maintaining fiber grating is used as a frequency-selecting element of the laser, and the narrow-linewidth optical fiber laser can be output under pumping excitation of the high-gain fiber by the single-mode semiconductor pump laser. The polarization state of the generated dual-frequency lasers is adjusted by the polarization beam splitter and the polarization controller, and then the dual-frequency lasers are re-coupled together by the optical coupler and injected into the photoelectric detector, so that the narrow-linewidth microwave signal with higher intensity can be output.

Meanwhile, the stress adjusting device controls the birefringence distribution in the low-reflectivity polarization-maintaining fiber grating by applying the stress to the low-reflectivity polarization-maintaining fiber grating, thereby controlling the laser frequencies working in different polarization modes in the resonant cavity. The tunable narrow-linewidth photo-generated microwave source is generated by the beat-frequency technology using dual-wavelength narrow-linewidth lasers with variable frequency intervals.

BRIEF DESCRIPTION OF THE DRAWINGS

FIG. 1 includes: 1—high-reflectivity fiber grating, 2—high-gain fiber, 3—low-reflectivity polarization-maintaining fiber grating, 4—stress adjusting device, 5—optical wavelength division multiplexer, 6—single-mode semiconductor pump laser, 7—polarization beam splitter, 8—polarization controller, 9—optical coupler, and 10—photoelectric detector.

DETAILED DESCRIPTION

The specific implementations of the present invention will be further described below with reference to the drawings and specific embodiments. It should be noted that the scope of protection claimed by the present invention is not limited to the scope expressed by the embodiments. If there are any processes or components that are not specifically described below, those skilled in the art can understand or realize them with reference to the prior art.

Embodiment 1

Figure 1:
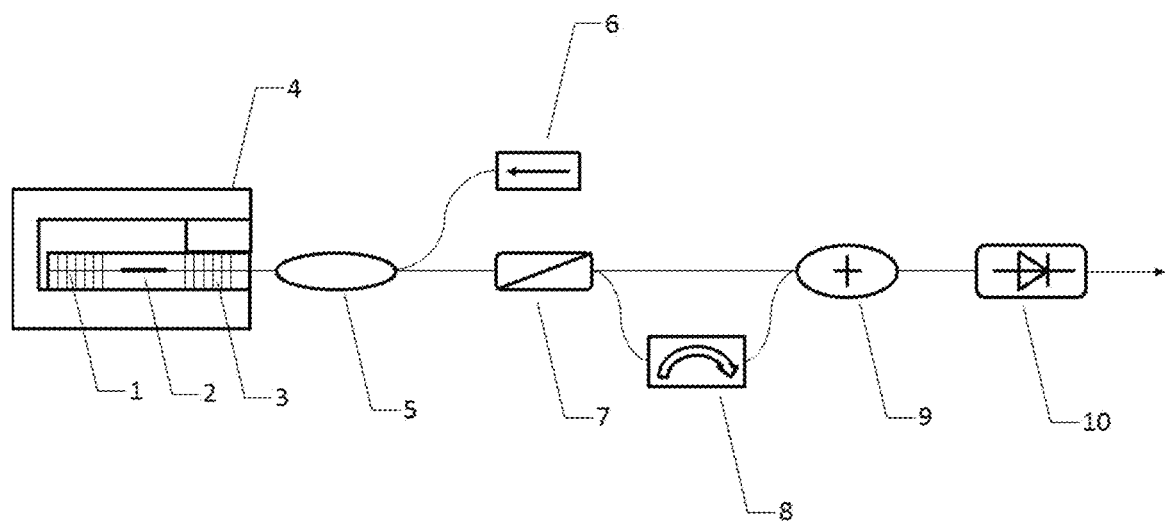
FIG. 1 is a schematic structural diagram of a tunable narrow-linewidth photo-generated microwave source based on polarization control in an embodiment.

A specific structure of a tunable narrow-linewidth photo-generated microwave source based on polarization control according to this embodiment is as shown in FIG. 1. A central reflection wavelength of a high-reflectivity fiber grating 1 according to this is a laser output wavelength which of 1550.12 nm, a 3 dB reflection spectrum width of 1.2 nm, and a central wavelength reflectivity greater than 99.95%. A slow-axis reflection peak central wavelength of a low-reflectivity polarization-maintaining fiber grating 3 is 1550.12 nm, and a fast-axis reflection peak central wavelength of the low-reflectivity polarization-maintaining fiber grating is 1550.50 nm, with a reflectivity of both 60%. A high-gain fiber 2 is a phosphate gain fiber co-doped with erbium and ytterbium. The high-gain fiber 2, the high-reflectivity fiber grating 1 and the low-reflectivity polarization-maintaining fiber grating 3 together form a Bragg reflection resonant cavity of a laser. A single-mode semiconductor pump laser 6 pumps into the resonant cavity through an optical wavelength division multiplexer 5 of 980/1550 nm. Due to birefringence in the low-reflectivity polarization-maintaining fiber grating, two reflection peaks with different polarization modes and different central wavelengths exist, so that the laser is enabled to realize orthogonal dual-frequency narrow-linewidth optical fiber laser output and output the laser from an output end of the optical wavelength division multiplexer 5. The output orthogonal dual-frequency laser is divided into a fast-axis laser and a slow-axis laser through a polarization beam splitter 7, wherein the slow-axis laser adjusts a polarization state thereof through a polarization controller 8 to destroy an orthogonal relationship between the slow-axis laser and the fast-axis laser, and then is re-coupled into one laser through an optical coupler 9, and injected into an indium-gallium-arsenic photoelectric detector 10, thus being capable of obtaining a microwave signal of about 50 GHz. Meanwhile, a stress adjusting device 4 can apply a lateral stress to the low-reflectivity polarization-maintaining fiber grating, wherein the stress adjusting device 4 is composed of an optical fiber groove made of a rigid material and a piezoelectric ceramic. When a direct-current voltage signal is applied to the piezoelectric ceramic, stretching of the piezoelectric ceramic will exert the lateral stress on the low-reflectivity polarization-maintaining fiber grating, thereby controlling the birefringence distribution in the low-reflectivity polarization-maintaining fiber grating, and laser frequencies in two different polarization modes corresponding to the low-reflectivity polarization-maintaining fiber grating are also changed, and a beat-frequency signal generated by injecting the laser into the indium-gallium-arsenic photoelectric detector 10 is also changed, and finally, a tunable narrow-linewidth photo-generated microwave signal source can be obtained.

Figure 2:
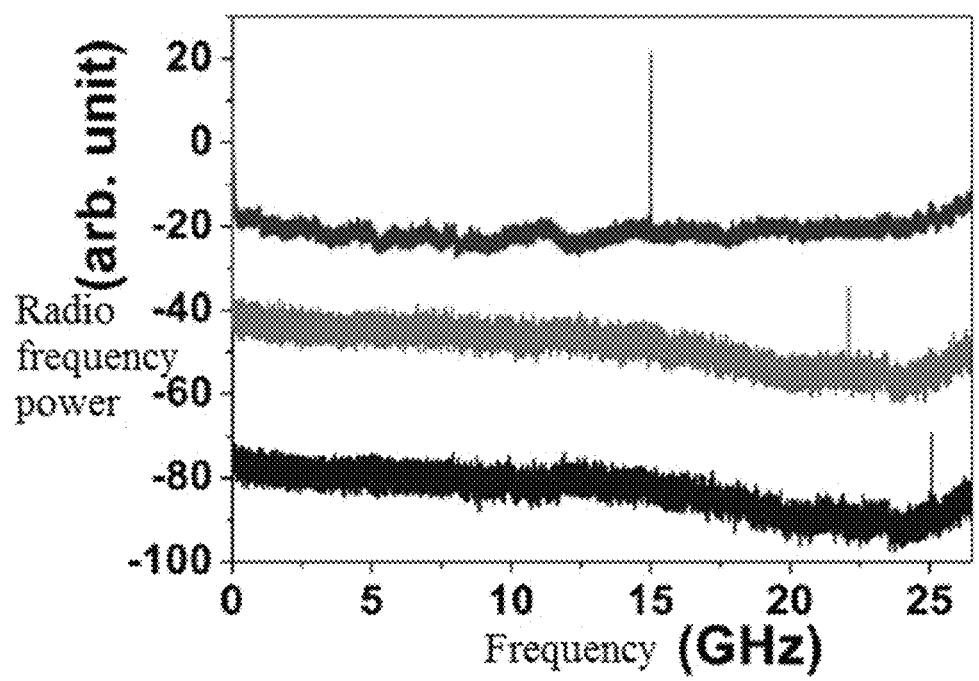
FIG. 2 is an output spectrum diagram of the tunable narrow-linewidth photo-generated microwave source based on polarization control in different states in the embodiment.
Figure 3:
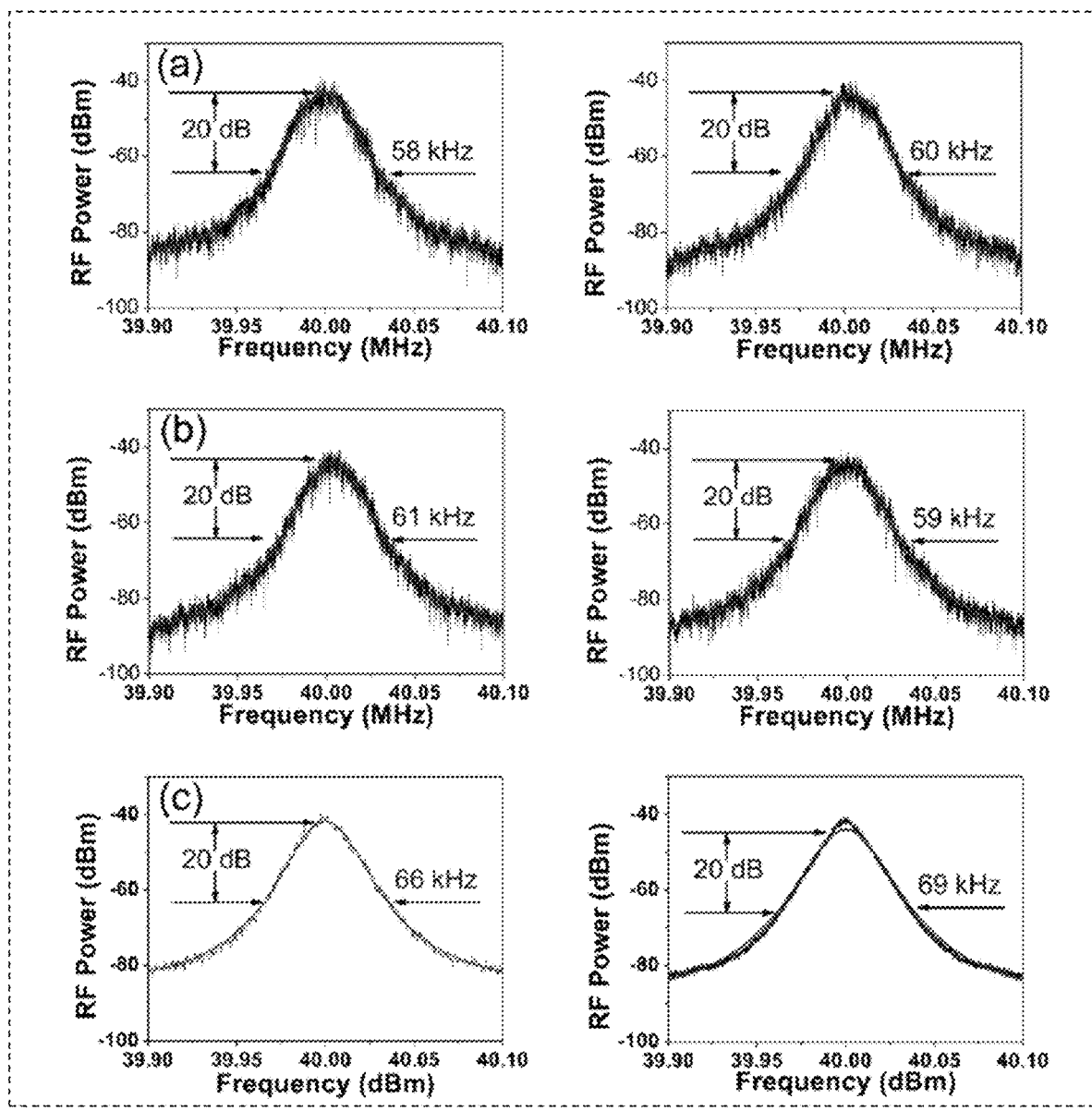
FIG. 3 is a graph showing linewidth measurement results of lasers output by the tunable narrow-linewidth photo-generated microwave source based on polarization control in different states (wherein an ordinate refers to a radio-frequency power and an abscissa refers to a frequency) in the embodiment.

The specific effects of this embodiment are as shown in FIG. 2 and FIG. 3. By adjusting the direct current voltage signal on the piezoelectric ceramics, three results are obtained, including 1550.124 nm and 1550.245 nm (interval of 15 GHz), 1550.060 nm and 1550.212 nm (interval of 22 GHz), 1550.092 nm and 1550.298 nm (interval of 25 GHz), and a corresponding spectrum of the radio-frequency signals obtained by beat-frequency is as shown in FIG. 2. In addition, an output laser linewidth in each state is measured separately, and the results are shown in (a), (b) and (c) in FIG. 3. It can be seen that a 20 dB bandwidth is less than 70 kHz under different conditions, and a corresponding 3 dB linewidth can basically keep less than 3.5 kHz.

In conclusion, the tunable narrow-linewidth photo-generated microwave source based on polarization control of the present invention takes the low-reflectivity polarization-maintaining fiber grating as a frequency-selecting element of the laser, and achieves the narrow-linewidth optical fiber laser output under pumping excitation of the single-mode semiconductor pump laser to the high-gain fiber. The polarization state of the generated dual-frequency lasers is adjusted by the polarization beam splitter and the polarization controller, and then the dual-frequency lasers are re-coupled together by the optical coupler and injected into the photoelectric detector, so that the narrow-linewidth microwave signal with higher intensity can be output.

Meanwhile, the stress adjusting device controls the birefringence distribution in the low-reflectivity polarization-maintaining fiber grating by applying the stress to the low-reflectivity polarization-maintaining fiber grating, thereby controlling the laser frequencies working in different polarization modes in the resonant cavity. The tunable narrow-linewidth photo-generated microwave source is generated by the beat-frequency technology using dual-wavelength narrow-linewidth lasers with variable frequency intervals.

What is claimed is:

1. A tunable narrow-linewidth photo-generated microwave source based on polarization control, comprising:
    a high-reflectivity fiber grating, a high-gain fiber, a low-reflectivity polarization-maintaining fiber grating, a stress adjusting device, an optical wavelength division multiplexer, a single-mode semiconductor pump laser, a polarization beam splitter, a polarization controller, an optical coupler, and a photoelectric detector;
    wherein the high-reflectivity fiber grating, the high-gain fiber, and the low-reflectivity polarization-maintaining fiber grating together form a resonant cavity of the laser, the high-gain fiber serves as a gain medium of the resonant cavity of the laser, and the high-reflectivity fiber grating and the low-reflectivity polarization-maintaining fiber grating form front and rear cavity mirrors of the resonant cavity, which are respectively connected with two ends of the high-gain fiber, so that a signal laser oscillates in the resonant cavity, and a first end of the optical wavelength division multiplexer is connected with the resonant cavity;
    an output end of the single-mode semiconductor pump laser is connected with a second end of the optical wavelength division multiplexer, and a pump laser is injected into the resonant cavity through the optical wavelength division multiplexer;
    due to birefringence in the low-reflectivity polarization-maintaining fiber grating, two reflection peaks with different polarization modes and different central wavelengths exist, so that the laser is enabled to realize orthogonal dual-frequency narrow-linewidth optical fiber laser output through the wavelength division multiplexer;
    an input end of the polarization beam splitter is connected with an output end of the optical wavelength division multiplexer to divide two lasers with different frequencies and different polarizations output by the optical wavelength division multiplexer into fast-axis laser and slow-axis laser;
    an output end of the polarization beam splitter is respectively connected with the polarization controller and the optical coupler, and an output of the optical coupler is connected with the photoelectric detector;
    a polarization state of the slow-axis laser is adjusted by the polarization controller to change an orthogonal relationship between the slow-axis laser and the fast-axis laser, is coupled with the fast-axis laser through the optical coupler and injected into the photoelectric detector, and a narrow-linewidth microwave signal is generated by a beat-frequency technology; and the stress adjusting device is arranged on the low-reflectivity polarization-maintaining fiber grating, changes birefringence distribution in the grating by changing a stress magnitude applied to the low-reflectivity polarization-maintaining fiber grating, controls output laser frequencies under different polarization modes, and outputs a tunable narrow-linewidth photo-generated microwave signal.

2. The tunable narrow-linewidth photo-generated microwave source based on polarization control according to claim 1, wherein the stress adjusting device is used for applying a lateral stress to the optical fiber to cause the birefringence distribution of the optical fiber to change.

3. The tunable narrow-linewidth photo-generated microwave source based on polarization control according to claim 1, wherein a material of the stress adjusting device is piezoelectric ceramics, mechanical adjusting frame or heavy-object extrusion device.

4. The tunable narrow-linewidth photo-generated microwave source based on polarization control according to claim 1, wherein the resonant cavity of the optical fiber laser is of a distributed Bragg reflection (DBR) cavity structure, a distributed feed-back (DFB) cavity structure or an annular cavity structure.

5. The tunable narrow-linewidth photo-generated microwave source based on polarization control according to claim 1, wherein an optical fiber used in the low-reflectivity polarization-maintaining fiber grating is a panda polarization-maintaining fiber, a bow-tie polarization-maintaining fiber or an optical fiber engraved with dual-wavelength reflection peaks.

6. The tunable narrow-linewidth photo-generated microwave source based on polarization control according to claim 1, wherein the high-reflectivity fiber grating is a single mode fiber grating, wherein the reflection peak of the high-reflectivity fiber grating covers two reflection peaks of the low-reflectivity fiber grating, and the high-reflectivity fiber grating has a reflectivity to signal laser greater than 90%.

7. The tunable narrow-linewidth photo-generated microwave source based on polarization control according to claim 1, wherein a frequency response range of the photoelectric detector is larger than a beat-frequency signal frequency generated by an optical fiber laser source.

8. The tunable narrow-linewidth photo-generated microwave source based on polarization control according to claim 7, wherein a material of the photoelectric detector is an indium-gallium-arsenic semiconductor material, a silicon semiconductor material or a germanium semiconductor material.

9. The tunable narrow-linewidth photo-generated microwave source based on polarization control according to claim 1, wherein a central reflection wavelength of the high-reflectivity fiber grating is a laser output wavelength of 1550.12 nm, a 3 dB reflection spectrum width of 1.2 nm, and a central wavelength reflectivity greater than 99.95%; a central wavelength of a slow-axis reflection peak of the low-reflectivity polarization-maintaining fiber grating is 1550.12 nm, and a fast-axis reflection peak of the low-reflectivity polarization-maintaining fiber grating is 1550.50 nm, with a reflectivity of both 60%.

10. The tunable narrow-linewidth photo-generated microwave source based on polarization control according to claim 1, wherein the high-gain fiber is a phosphate gain fiber co-doped with erbium and ytterbium.

11. The tunable narrow-linewidth photo-generated microwave source based on polarization control according to claim 2, wherein the high-gain fiber is a phosphate gain fiber co-doped with erbium and ytterbium.

12. The tunable narrow-linewidth photo-generated microwave source based on polarization control according to claim 3, wherein the high-gain fiber is a phosphate gain fiber co-doped with erbium and ytterbium.

13. The tunable narrow-linewidth photo-generated microwave source based on polarization control according to claim 4, wherein the high-gain fiber is a phosphate gain fiber co-doped with erbium and ytterbium.

14. The tunable narrow-linewidth photo-generated microwave source based on polarization control according to claim 5, wherein the high-gain fiber is a phosphate gain fiber co-doped with erbium and ytterbium.

15. The tunable narrow-linewidth photo-generated microwave source based on polarization control according to claim 6, wherein the high-gain fiber is a phosphate gain fiber co-doped with erbium and ytterbium.

16. The tunable narrow-linewidth photo-generated microwave source based on polarization control according to claim 7, wherein the high-gain fiber is a phosphate gain fiber co-doped with erbium and ytterbium.

17. The tunable narrow-linewidth photo-generated microwave source based on polarization control according to claim 8, wherein the high-gain fiber is a phosphate gain fiber co-doped with erbium and ytterbium.

18. The tunable narrow-linewidth photo-generated microwave source based on polarization control according to claim 9, wherein the high-gain fiber is a phosphate gain fiber co-doped with erbium and ytterbium.

* * * * *